(12) United States Patent
Kashi et al.

(10) Patent No.: US 9,902,093 B2
(45) Date of Patent: Feb. 27, 2018

(54) PRESS-FORMING MOLD AND METHOD FOR MANUFACTURING PROTECTIVE FILM FOR PRESS-FORMING MOLD

(75) Inventors: Takaharu Kashi, Imizu (JP); Kenji Yamamoto, Kobe (JP)

(73) Assignees: NIPPON KOSHUHA STEEL CO., LTD., Tokyo (JP); KOBE STEEL, LTD., Kobe-shi, Hyogo (JP)

( * ) Notice: Subject to any disclaimer, the term of this patent is extended or adjusted under 35 U.S.C. 154(b) by 485 days.

(21) Appl. No.: 14/009,522

(22) PCT Filed: Apr. 3, 2012

(86) PCT No.: PCT/JP2012/059103
§ 371 (c)(1),
(2), (4) Date: Oct. 2, 2013

(87) PCT Pub. No.: WO2012/144318
PCT Pub. Date: Oct. 26, 2012

(65) Prior Publication Data
US 2014/0023740 A1   Jan. 23, 2014

(30) Foreign Application Priority Data

Apr. 18, 2011  (JP) ................. 2011-091900

(51) Int. Cl.
*B29C 33/68* (2006.01)
*B21D 37/01* (2006.01)
(Continued)

(52) U.S. Cl.
CPC .............. *B29C 33/68* (2013.01); *B21D 37/01* (2013.01); *C23C 14/0641* (2013.01); *C23C 14/5886* (2013.01)

(58) Field of Classification Search
None
See application file for complete search history.

(56) References Cited

U.S. PATENT DOCUMENTS 4,747,864 A    5/1988 Hagerty et al.
6,528,386 B1 * 3/2003 Summerfelt et al. ......... 438/401
(Continued)

FOREIGN PATENT DOCUMENTS

CN    101203366 A    6/2008
DE    197 14 317 C1   6/1998
(Continued)

OTHER PUBLICATIONS

International Search Report (ISR) (PCT Form PCT/ISA/210) dated Jul. 10, 2012, in PCT/JP2012/059103.
(Continued)

*Primary Examiner* — Jacob T Minskey
(74) *Attorney, Agent, or Firm* — McGinn I.P. Law Group, PLLC.

(57) ABSTRACT

A press-forming mold has a protective film for preventing seizing during press-forming formed on at least a forming surface that comes into contact with a formed body. The protective film is formed by PVD. An arbitrary selection section extracted from the surface of the protective film is divided into a plurality of individual sections; and, when the gradient of the surface at the $n^{th}$ division point is represented by $(dZn/dXn)$, taking N to represent the number of divisions, the root-mean-square $R\Delta q$ calculated by the following numerical expression is no greater than 0.032.

$$R\Delta q = \sqrt{\frac{1}{N}\sum_{n=1}^{N}\left(\frac{dZ_n}{dX_n}\right)^2}$$

(Continued)

It is thereby possible to improve the seizing resistance of a press-forming mold having a protective film formed by PVD.

14 Claims, 9 Drawing Sheets

(51) Int. Cl.
  *C23C 14/06* (2006.01)
  *C23C 14/58* (2006.01)

(56) References Cited

U.S. PATENT DOCUMENTS

| | | |
|---|---|---|
| 2006/0166503 A1 | 7/2006 | Sasaki et al. |
| 2008/0182091 A1* | 7/2008 | Guenanten et al. .......... 428/220 |
| 2009/0317659 A1* | 12/2009 | Yamamoto .................... 428/655 |

FOREIGN PATENT DOCUMENTS

| | | |
|---|---|---|
| EP | 0 250 091 A1 | 12/1987 |
| JP | H11-277131 A | 10/1999 |
| JP | 2005-15852 A | 1/2005 |
| JP | 2005-28544 A | 2/2005 |
| JP | 2005-238264 A | 9/2005 |
| JP | 2005-305510 A | 11/2005 |
| JP | 2005-347568 A | 12/2005 |
| JP | 2007-191751 A | 8/2007 |
| JP | 2008-31011 A | 2/2008 |

OTHER PUBLICATIONS

Extended European Search Report dated Aug. 28, 2014.
Chinese Office Action dated Jun. 25, 2015 with a partial English translation.
European Search Report dated Apr. 11, 2016.

* cited by examiner (a)

(b)

ARBITRARY SECTION
N DIVISIONS n=0
n=1
n=2
n=3
n=4

$i^{th}$ DIVISION POINT n=N-1
n=N

TILT: $dZ_i/dX_i$ (c)

(a)

(b)

(a)

(b)

(c)

(d)

(a)

(b)

(a)

(b)

PRESS-FORMING MOLD AND METHOD FOR MANUFACTURING PROTECTIVE FILM FOR PRESS-FORMING MOLD

TECHNICAL FIELD

The present invention relates to a press-forming mold in which a protective film for preventing seizing is formed on a surface that comes into contact with a formed body to be press-formed, and a method for manufacturing this press-forming mold; and in particular, relates to a press-forming mold in which the seizing resistance of the protective film formed by PVD is improved, and a method for manufacturing same.

BACKGROUND ART

Press-forming molds are used in a manner in which shearing work and bending work are repeatedly performed on the formed body; therefore, friction is generated with respect to the metal material of the formed body, and the surface of the mold is prone to seizing caused by frictional heat. In an instance in which a lubricant is used to prevent seizing, a problem is presented in that there is a need to perform processes such as degreasing on the formed body after press-forming, making the post-processing after the press-forming more troublesome.

In recent years, in order to prevent this problem, a protective film for preventing seizing is formed on the forming surface that comes into contact with the formed body. For example, patent document 1 discloses a technique for forming a hard protective film having lubricating properties such as diamond-like carbon (DLC) on the surface of the mold by chemical vapor deposition (CVD), physical vapor deposition (PVD), or a similar method. Patent document 1 discloses that when the surface roughness of the protective film is such that the maximum height Ry is equal to or less than 8 μm, the durability of the tool will be improved, and discloses performing polishing by diamond lapping or a similar method in order to reduce the surface roughness Ry of the protective film (e.g., paragraphs [0035] and [0047] in patent document 1).

Patent document 2 discloses a method for manufacturing a tool such as a mold in which wear resistance is required, and discloses that when a protective film is formed on the surface of the tool substrate by arc ion plating, which is a type of PVD, some of the metal material of the target scatters and adheres to the protective film, and spherical microparticles having a diameter of 1 to 5 μm reduce the tool lifespan. Such microparticles are referred to as droplets. In an instance in which a protective film is formed by PVD, the protective film is formed so as to have a smoother surface than in an instance in which a method such as CVD is used. Accordingly, the droplets are typically not removed, and if a process for removing the droplets is performed, a problem is presented in that the surface of the tool substrate is exposed in a localized manner and the effect of the protective film can no longer be obtained. In patent document 2, the droplets are mechanically removed by lapping or a similar process, and a second layer of coating is then further formed on the lapping-processed protective film to fill the concave parts formed by removing the droplets (paragraphs [0002] through [0016] in patent document 2).

Patent document 3 discloses a protective film including one or both of Co or Ni, and discloses that adding Co and Ni to the protective film improves the performance of the protective film in adsorbing the lubricant, making it possible to reduce the friction coefficient of the surface of the protective film. As with patent document 2, patent document 3 also discloses adhesion of the droplets taking place in an instance in which a protective film is formed by PVD. However, patent document 3 sets forth that the droplets adhering to the protective film are caused to successively fall off through contact with the formed body if the droplets are present in an appropriate density, reducing the eventual friction coefficient of the protective film surface. Meanwhile, patent document 3 sets forth that if the surface roughness of the protective film is such that the maximum height Ry exceeds 0.6 μm, the effect of providing the protective film is reduced, and also discloses removing the droplets by lapping in order to prevent such a phenomenon. In this instance, as with patent document 2, a second layer of coating is further formed on the lapping-processed protective film (e.g., paragraphs [0029]-[0035] in patent document 3).

PRIOR ART DOCUMENTS

Patent Documents

Patent Document 1: Japanese Laid-open Patent Application No. 2005-305510
Patent Document 2: Japanese Laid-open Patent Application No. 2005-28544
Patent Document 1: Japanese Laid-open Patent Application No. 2008-31011

DISCLOSURE OF THE INVENTION

Problems the Invention is Intended to Solve

However, the above-mentioned prior art presents the following problems. In patent document 1, performing lapping on the surface if the protective film has a high surface roughness improves the seizing resistance of the mold. However, since the surface roughness of the protective film is managed using the maximum height Ry, only the tips 101 of the protruding parts are removed by lapping as shown in FIGS. 8(a) and 8(b). A problem is presented in that concave parts 102 remain after lapping, resulting in the concave parts acting as notches and making impact failure or fatigue failure more likely. A problem is also presented in that after lapping, slopes 103 having a steep gradient remain on the side parts of the protruding parts, making polishing residues more likely to adhere between the protruding parts. Similar problems are presented in an instance in which the surface roughness of the protective film is managed by the ten-point average roughness Rz and the arithmetic average roughness Ra stipulated in JIS B0601.

In the stipulation for the surface roughness in JIS B0601, as shown in FIG. 9, the surface roughness calculated in an instance in which the gradient of the slope 103 between the convex and concave parts on the surface is steep (FIG. 9(a)) and that calculated in an instance in which the gradient is gentle (FIG. 9(b)) are identical. Therefore, in both instances, the lapping applied is such that the height obtained is identical. Accordingly, a problem is presented in that, as shown in FIG. 9, there is a difference in the gradient of the slope of the convex and concave parts, which has a significant effect on the wear resistance, and there is a variation in the seizing resistance of the mold.

In patent document 2, after the droplets are removed, a coating is further formed on the lapping-processed protective film, whereby the wear resistance of the protective film is prevented from decreasing. However, patent document 2 does not disclose any technique for managing the thickness and the surface roughness of the second layer of coating. Therefore, the surface state of the protective film surface, which directly comes into contact with the formed body, is unknown.

As with patent document 1, patent document 3 also involves a problem in that since the surface roughness of the protective film is managed by maximum height Ry, the mold is prone to impact failure or fatigue failure, and adhesion of polishing residue readily occurs. Although patent document 3 discloses that the second layer of coating results in the desired surface roughness being obtained, polishing is not performed on the second layer of coating, which directly comes into contact with the formed body. Specifically, in patent document 3, in order to obtain a predetermined surface roughness (maximum height Ry) in the second layer of coating, there is a need to investigate, using a test piece provided separately from the mold on which a protective film is actually formed, a coating thickness at which the predetermined surface roughness can be obtained. There is also a risk of a variation occurring in the surface roughness in the second layer of coating, and a problem of low productivity is presented.

The present invention was conceived in the light of the abovementioned problems, it being an object thereof to provide a press-forming mold having a protective film formed by PVD, wherein the press-forming mold has a high seizing resistance, as well as a method for manufacturing a protective film for a press-forming mold.

Means for Solving the Problem

A press-forming mold according to the present invention is a press-forming mold in which a protective film for preventing seizing during press-forming is formed on at least a forming surface that comes into contact with a formed body, wherein: the protective film is formed by PVD; an arbitrary selection section extracted from the surface of the protective film is divided into a plurality of individual sections; and when the n" division point from an end of the selected section is defined as being located a distance of dXn in the direction of extension of the selected section and dZn in the height direction from the $(n-1)^{th}$ division point, and the gradient of the surface at the $n^{th}$ division point is represented by (dZn/dXn), taking N to represent the number of divisions, the root-mean-square RΔq calculated by the following expression is no greater than 0.032. In the press-forming mold according to the present invention, the surface roughness of the protective film is managed by the root-mean-square RΔq calculated from the tilt of the surface at each of the division points. Specifically, the root-mean-square RΔq is calculated from the tilt of the surface at each of the division points according to stipulations in JIS B0601 (1994, ditto hereafter) and JIS B0031 (1994, ditto hereafter), and having the value RΔq so as to be no greater than 0.032 results in the seizing resistance being improved.

$$R\Delta q = \sqrt{\frac{1}{N}\sum_{n=1}^{N}\left(\frac{dZ_n}{dX_n}\right)^2} \quad \text{[Expression 1]}$$

In the press-forming mold according to the present invention, the protective film is, e.g., one that is formed by PVD in which a metal material containing at least 50 atom % of Al is used as a target.

The protective film is, e.g., one in which a first thin film comprising a TiAlN-based material is formed on a side that comes into contact with the formed body. In such an instance, it is preferable that the protective film has, e.g., a second thin film comprising a CrN-based material formed on the forming surface, and the first thin film formed on the second thin film.

A method for manufacturing a protective film for a press-forming mold according to the present invention is a method for manufacturing a protective film for a press-forming mold in which a protective film for preventing seizing during press-forming is formed on at least a forming surface of the press-forming mold that comes into contact with a formed body, the method having: a step for forming a protective film by PVD on the forming surface in a reaction gas atmosphere using, as a target, a metallic material to become the protective film; and a step for polishing the surface of the protective film; wherein in the step for polishing the surface of the protective film, the polishing is performed so that: an arbitrary selection section extracted from the surface of the protective film is divided into a plurality of individual sections; and, when the $n^{th}$ division point from an end of the selected section is defined as being located a distance of dXn in the direction of extension of the selected section and dZn in the height direction from the $(n-1)^{th}$ division point, and the gradient of the surface at the $n^{th}$ division point is represented by (dZn/dXn), taking N to represent the number of divisions, the root-mean-square RΔq is calculated by the following expression is no greater than 0.032.

$$R\Delta q = \sqrt{\frac{1}{N}\sum_{n=1}^{N}\left(\frac{dZ_n}{dX_n}\right)^2} \quad \text{[Expression 2]}$$

Effects of the Invention

In the press-forming mold of the present invention, the surface roughness of the protective film formed on the surface of a mold by PVD is stipulated by the parameter RΔq in an arbitrary selection section. This parameter RΔq is calculated from the gradient of the surface at each division point obtained by dividing an arbitrary selection section into a plurality of individual sections; therefore, the surface state of the protective film can be managed in a more accurate manner than in an instance in which the surface roughness is managed by the maximum height or similar factors. Having the parameter RΔq be no greater than 0.032 makes it possible to obtain a high seizing resistance in the press-forming mold.

In the present invention, the surface state of the protective film is managed by the gradient of each of a plurality of divided sections, and the protective film after polishing has a smaller gradient. Accordingly, it is possible to prevent impact failure and fatigue failure of the mold in which the concave parts after lapping act as notches, as well as to prevent adhesion of polishing residue. Therefore, according to the present invention, the lifespan of the press-forming mold can be dramatically improved.

Therefore, according to the protective film for a press-forming mold manufactured according to the method of the present invention, the seizing resistance of the press-forming mold can be increased and the lifespan can be improved.

BEST MODE FOR CARRYING OUT THE INVENTION

Figure 1:
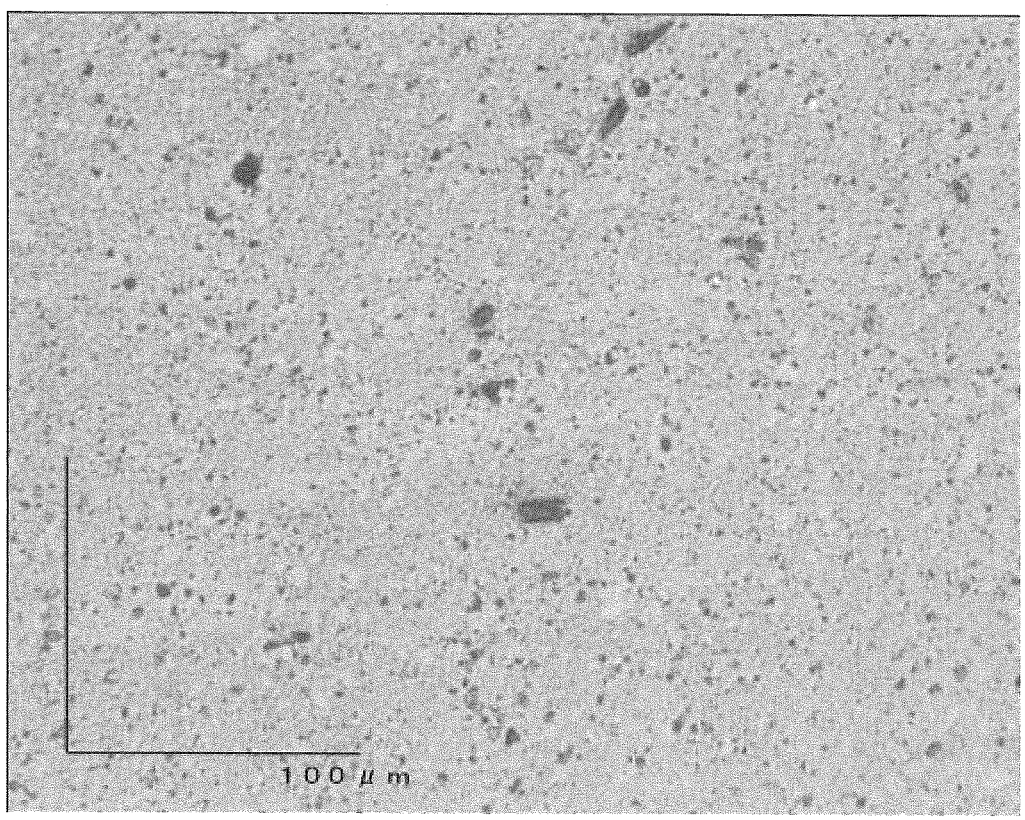
FIG. 1 is an SEM photograph (magnification: 500) showing the surface of a protective film in a press-forming mold according to the present invention.

A press-forming mold according to an embodiment of the present invention will now be described. The press-forming mold according to the present invention is a die 11, a punch 12, and other elements in a press-forming device 10 such as that shown, e.g., in FIG. 6, and is used as follows. Specifically, a formed body, e.g., a plate material 2, is placed on the punch 12, and an elastic force is then applied across a pad 13 or a similar element using, e.g., an elastic member, whereby the plate material 2 is fixed on the punch 12. In this state, the die 11 is lowered from above the plate material 2, and the plate material 2 is sandwiched between the die 11 and the punch 12, whereby the plate material 2 is press-formed to a predetermined shape.

Figure 6:
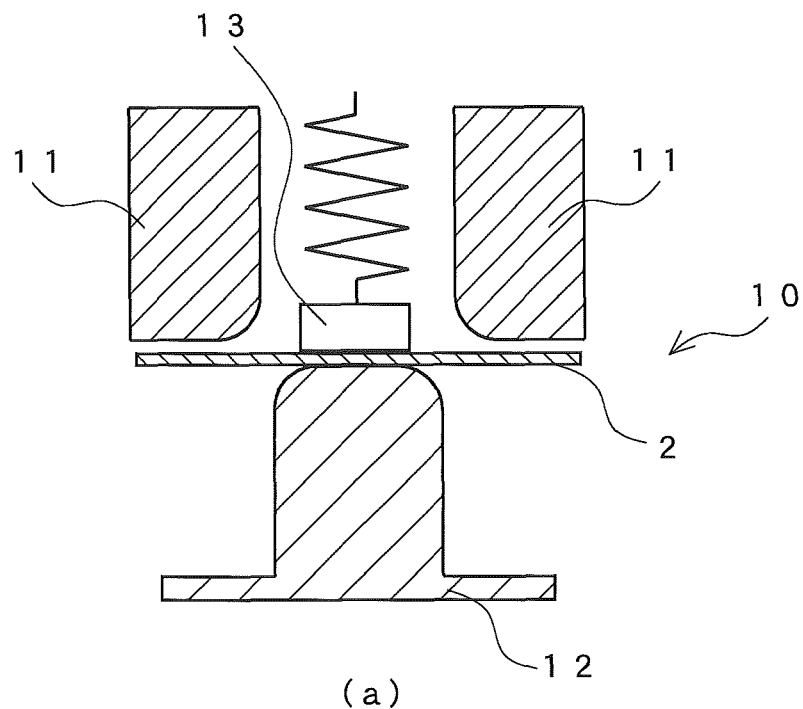
FIG. 6 is a schematic diagram showing press-forming of a plate material.
Figure 6:
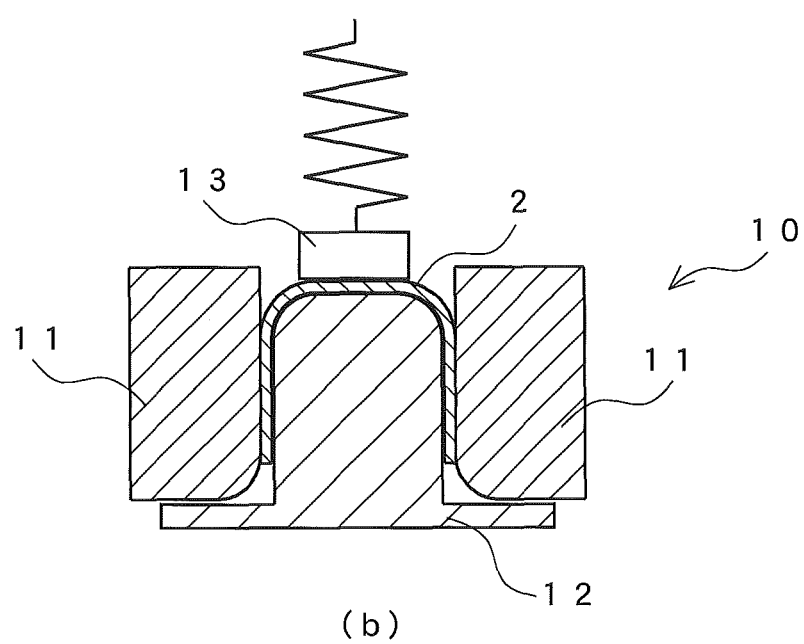

In this example shown in FIG. 6, since shearing work and bending work are repeatedly applied to the plate material 2, in portions of the die 11 and the punch 12 that come into contact with the plate material 2, friction occurs and frictional heat is generated, whereby seizing occurs on the surface of the die 11 and the punch 12, and the die 11 and the punch 12 is rendered unusable.

In order to prevent this seizing, in the press-forming mold of the present invention, a protective film for preventing seizing is formed on at least the forming surface that comes into contact with the formed body. In the present invention, the protective film is formed by a PVD technique such as ion plating.

The protective film is formed, e.g., by a PVD technique in which a metal material containing at least 50 atom % of Al is used as the negative electrode (target). In other words, the metal material used as the target contains, e.g., 52 to 55 atom % of Al. The metal material contains, other than Al, e.g., 20 to 22 atom % of Ti, 20 to 22 atom % of Cr, and about 5% of Si.

In the protective film in the present invention, e.g., Nitrogen is used as the process gas, and the metal material is vapor-deposited onto the surface of the mold, whereby a thin film made from a TiAlN-based material (first thin film) is formed at a thickness of, e.g., 1 to 5 μm. The TiAlN-based protective film has been conventionally used as a protective film, and is formed by PVD, whereby droplets, resulting from scattering and adhesion of metal that could not be ionized when a part of the target metal of the evaporation source evaporated, are formed on the surface of the protective film. Performing press-forming while the droplets remain adhered to the protective film causes seizing of the press-forming mold, and the droplets are therefore removed by polishing in the present invention. In the present invention, instead of using the conventional reference for the surface roughness, the root-mean-square RΔq as stipulated in JIS B0601 and JIS B0031 is used, and this parameter RΔq is managed so as to be no greater than 0.032. Specifically, where an arbitrary section of the surface of the protective film is extracted and divided into a plurality of individual sections, with N representing the number of divisions, and the $n^{th}$ division point from the end of the selected section is defined as being located at a distance of dXn in the distance of extension of the selected section and dZn in the height direction from the $(n-1)^{th}$ division point, and the gradient of the surface at the $n^{th}$ division point is represented by (dZn/dXn), the parameter RΔq is calculated by the following expression 3 as the root-mean-square of the gradient at each division point. For example, the section from 1 mm to 4 mm is divided into 1668 to 6667 sections, and the parameter RΔq is calculated.

$$R\Delta q = \sqrt{\frac{1}{N}\sum_{n=1}^{N}\left(\frac{dZ_n}{dX_n}\right)^2} \qquad \text{[Expression 3]}$$

Figure 2:
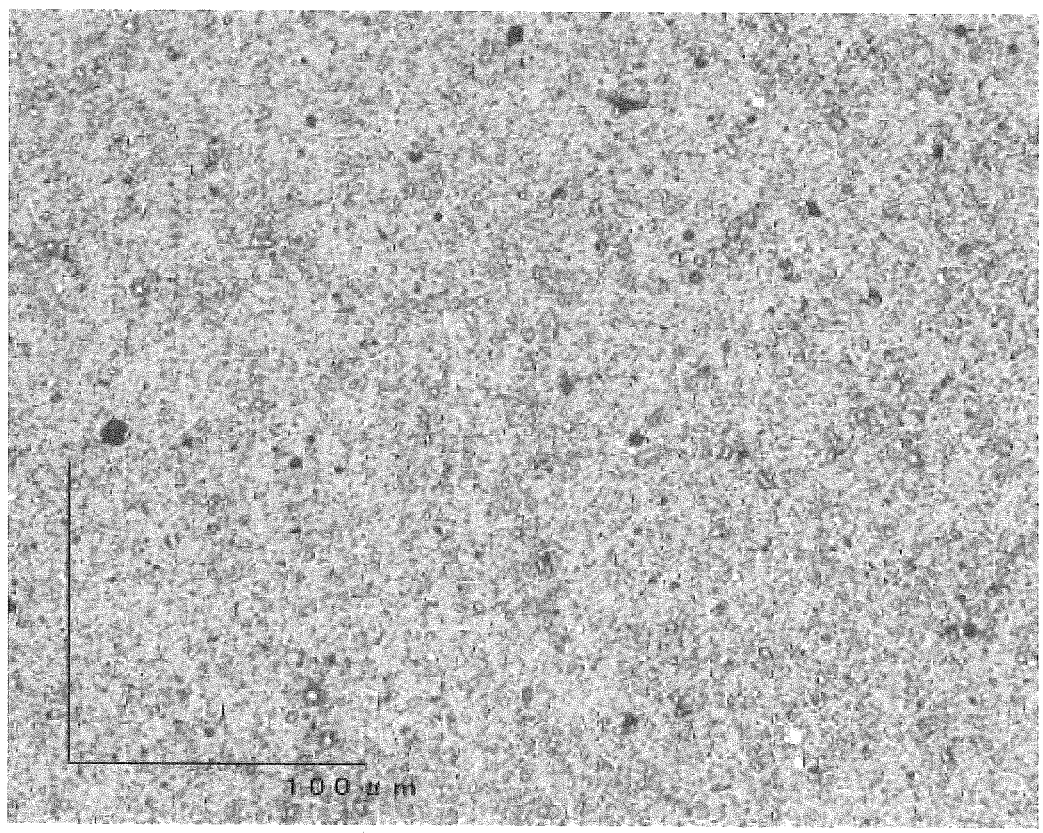
FIG. 2 is an SEM photograph (magnification: 500) showing the surface of a post-lapping protective film having a large surface roughness.
Figure 3:
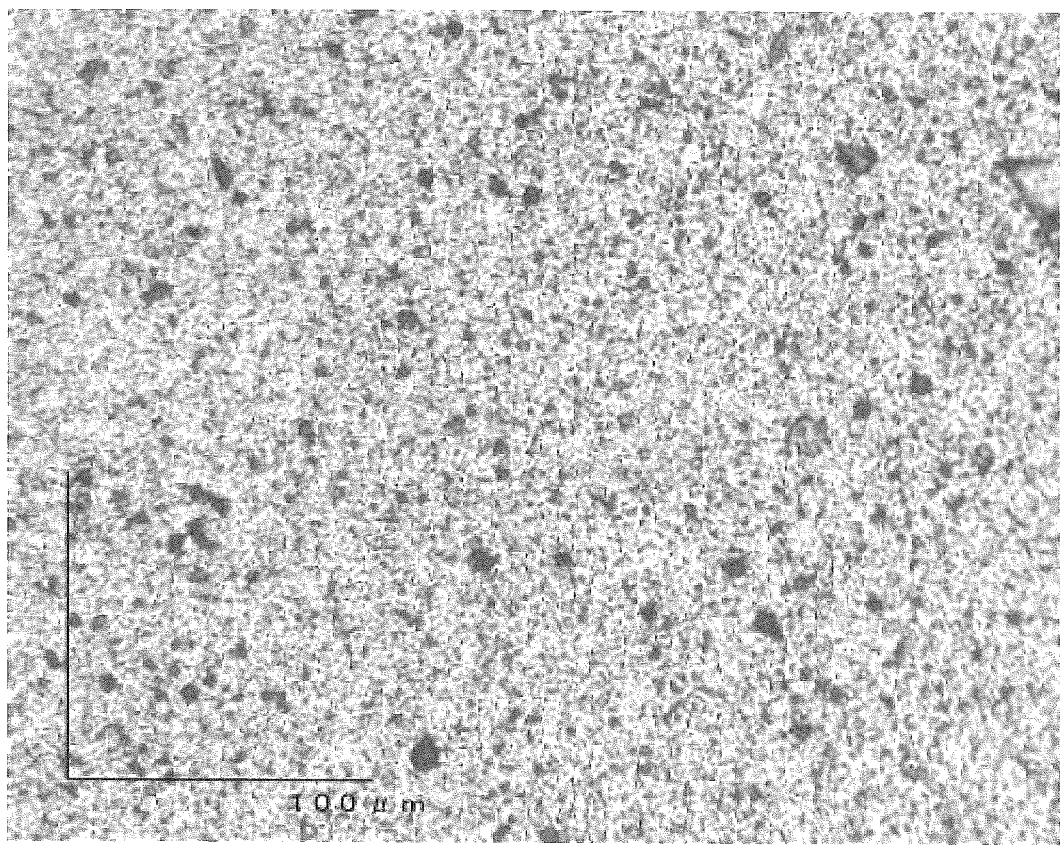
FIG. 3 is an SEM photograph (magnification: 500) showing the surface of a conventional post-lapping protective film.
Figure 4:
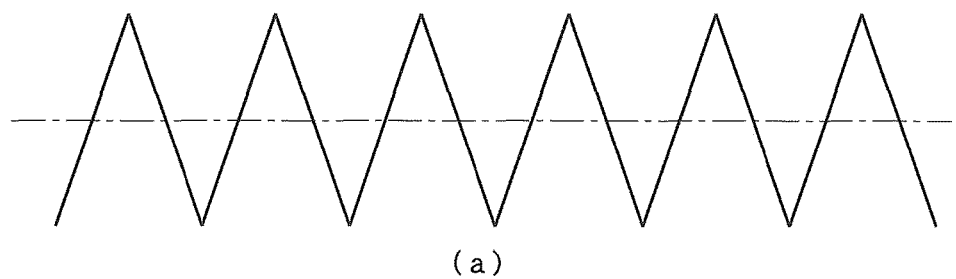
FIGS. 4(a) through (c) show the method for adjusting the surface roughness of the protective film in the press-forming mold according to the present invention in comparison with a conventional method for adjusting the surface roughness.
Figure 4:
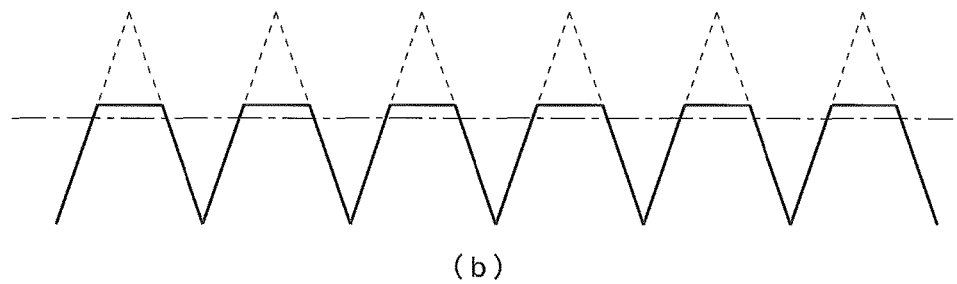
Figure 4:
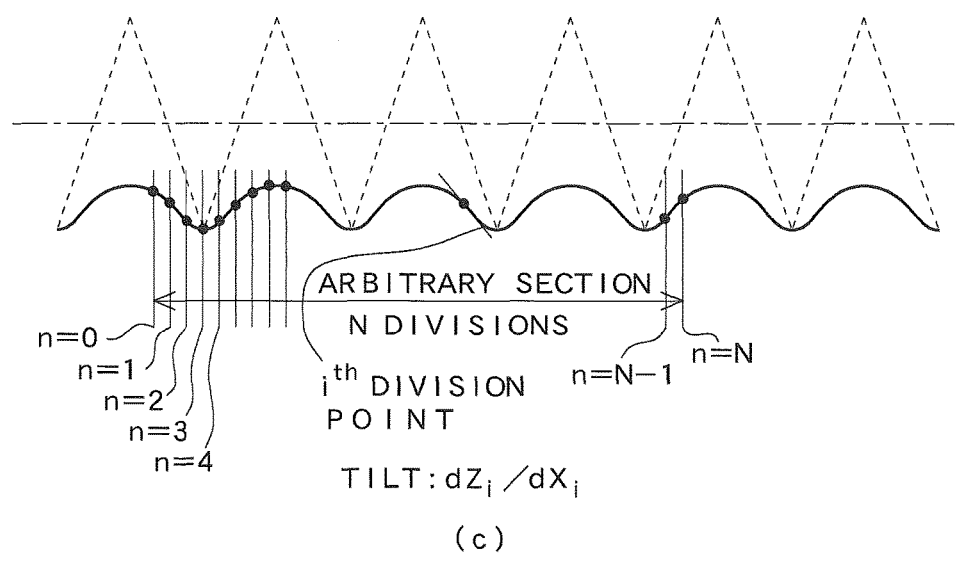

FIG. 1 is an SEM photograph showing the surface of the protective film in a press-forming mold according to the present invention; FIG. 2 is an SEM photograph showing the surface of a post-lapping protective film having a high surface roughness; and FIG. 3 is an SEM photograph showing the surface of a conventional post-lapping protective film. The magnification in each of FIGS. 1 to 3 is 500. Conventionally, when the droplets are lapped, the surface roughness of the lapped protective film is managed by maximum height Ry, the ten-point average roughness Rz and the arithmetic average roughness Ra stipulated in JIS B0601; therefore, as shown in FIG. 4(b), only the tips of the convex and concave parts on the surface are removed by lapping, and sharp corners remain at the tips of the convex parts and the concave parts on the surface of the protective film as shown in FIG. 3. Then, a problem is presented in that the protective film is more prone to impact failure or fatigue failure or the adhesion of polishing residue will result in a shorter mold lifespan, or that there will be a variation in the seizing resistance of the mold between an instance in which the slope between the convex and concave parts on the surface of the protective film has a steep gradient and an instance in which the slope has a gentle gradient. However, in the present invention, as described above, the surface roughness is managed by the gradient at each division point using the parameter RΔq, and polishing is performed so that the parameter RΔq is no greater than 0.032. The convex and concave structures on the surface are thereby polished so as to be uniformly smooth as shown in FIG. 4(c), and no sharp portions remain on the surface of the protective film as shown in FIG. 1. It is thereby possible in the present invention to avoid the abovementioned problems, significantly reduce the friction between the protective film and the press-formed item such as a metal plate, prevent seizing of the mold, and thereby dramatically improve the lifespan of the press-forming mold. Even if the surface roughness of the protective film is managed by the parameter RΔq, if the RΔq exceeds 0.032, concave parts remain on the surface of the protective film as shown in FIG. 2, and the effect of the present invention cannot be sufficiently obtained.

Figure 5:
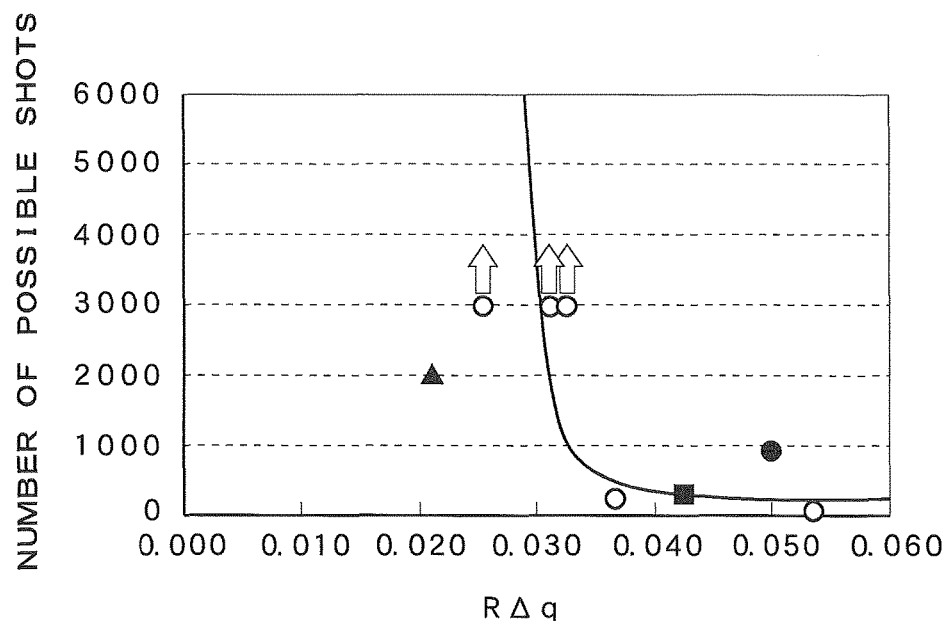
FIG. 5 is a graph showing the change in the number of possible shots that can be performed by the press-forming die relative to the parameter RΔq.

The reason for the numerical limitation on the parameter RΔq in the present invention will now be described with reference to FIG. 5. FIG. 5 is a graph showing the change in the number of possible shots that can be performed by a press-forming mold in relation to the parameter RΔq. Each of the plots on the graph represent the result of tests in the examples described further below, White circle plots represent instances in which a TiAlN-based protective film is formed by arc ion plating; black circle plots represent instances in which a TiC-based protective film is formed by arc ion plating; the triangular plot represents an instance in which a VC-based protective film is formed by molten salt immersion; and the square plot represents an instance in which a TiN-based protective film is formed by arc ion plating. The solid line in FIG. 5 represents the relationship between the number of possible shots that can be performed by the press-forming mold in relation to RΔq, calculated on the basis of endurance test results for the TiAlN-based protective film. As shown in FIG. 5, in the region in which the parameter RΔq exceeds 0.032, the number of possible shots that can be performed by the press-forming mold is less than 300, representing a short mold lifespan. However, once the parameter RΔq is equal to or less than 0.032, the number of possible shots dramatically increase to over 1000, and reaches 6000 at a parameter RΔq of 0.030. Thus using parameter RΔq to manage the surface roughness of the protective film makes it possible to dramatically improve the durability lifespan of the mold. As shown in FIG. 5, the parameter RΔq is required to be equal to or less than 0.032, and is preferably equal to or less than 0.030. However, regardless of these values, a smaller RΔq is always preferable. As shown in FIG. 5, in an instance in which a VC-based protective film is formed by molten salt immersion, the number of possible shots that can be performed by the press-forming mold is about 2000, and the effect of improving the lifespan is smaller than that in the instance of PVD such as arc ion plating. Accordingly, in the present invention, the protective film is preferably formed by a PVD technique such as arc ion plating.

A protective film representing a base (second thin film) made from, e.g., a CrN-based material may be formed on the surface of the mold at a thickness of, e.g., 2 to 5 μm in order to improve the adhesion between the first thin film and the mold, which is the substrate, as well as the pressure resistance of the protective film as a whole.

A method for manufacturing a protective film for a press-forming mold according to the present invention will now be described. First, a mold for protective film formation is introduced into a chamber into which a processing gas, e.g., nitrogen gas, is supplied. The mold is then placed on, e.g., a rotary table connected to, e.g., a bias power source. A target having, e.g., a flat plate shape connected to an arc power source is provided to the side wall of the vacuum chamber. The target is, e.g., a metal plate containing 52 to 55 atom % of Al, and further containing 20 to 22 atom % of Ti, 20 to 22 atom % of Cr, and about 5% of Si. When power is supplied from both of the power sources, an arc discharge is generated between the mold and the target, and an arc spot is formed on the surface of the target. Electrical energy concentrating on the arc spot causes components such as Al, Ti, and Cr in the metal material to instantaneously vaporize and ionize, and scatter in the vacuum chamber. The ionized metal particles react with the process gas, e.g., N, adhere as a thin film on the surface of the mold, and a protective film is formed. When the protective film is formed on the surface of the mold at the predetermined thickness, the mold having the protective film is removed from the vacuum chamber.

Next, the protective film formed on the surface of the mold is polished. Lapping is conventionally performed by hand lapping using, e.g., a rotary tool, or performed using a sponge-type polishing material having a small surface roughness; e.g., no higher than #600. In other words, a soft polishing material is conventionally used to avoid the risk of overpolishing the surface of the protective film. However, in the present invention, lapping is performed through applying a diamond paste on a relatively hard polishing material obtained, e.g., by solidifying felt, so that the surface roughness is, e.g., about #3000. It is thereby possible to resolve any insufficient droplet polishing that results from conventional polishing methods, and to sufficiently polish the surface of the protective film.

When polishing the protective film, the parameter RΔq is used to manage the surface roughness of the protective film. Specifically, an arbitrary section of the surface of the protective film is extracted and divided into a plurality of individual sections; and, when the $n^{th}$ division point from the end of the selected section is defined as being located at a distance of dXn in the direction of extension of the selected section and dZn in the height direction from the $(n-1)^{th}$ division point, and the gradient of the surface at the $n^{th}$ division point is represented by (dZn/dXn), taking N to represent the number of divisions, RΔq is calculated by the following expression 4 as the root-mean-square of the gradient at each division point. For example, the section from 1 mm to 4 mm is divided into 1668 to 6667 sections, and the parameter RΔq is calculated.

$$R\Delta q = \sqrt{\frac{1}{N}\sum_{n=1}^{N}\left(\frac{dZ_n}{dX_n}\right)^2} \qquad \text{[Expression 4]}$$

In the present invention, polishing is performed so that the parameter RΔq of the surface roughness is no greater than 0.032, whereby the convex and concave structures on the surface are polished so as to be uniformly smooth, and as shown in FIG. 1, no sharp portions remain on the surface of the protective film. It is thereby possible to avoid the problem of the protective film being more prone to impact failure or fatigue failure or the adhesion of polishing residue resulting in a shorter mold lifespan, or of there being a variation in the seizing resistance of the mold. In addition, it is possible to: significantly reduce the friction between the protective film and the press-formed article, e.g., the metal plate; prevent seizing of the mold; and thereby dramatically improve the lifespan of the press-forming mold.

In an instance in which a protective film representing a base (second thin film) made from, e.g., a CrN-based material is formed on the surface of the mold, the second thin film may be formed by arc ion plating, prior to the formation of the first thin film, using a target containing metal Cr and 50 atom % or less of Group 4, Group 5, or Group 6A metal elements.

EXAMPLES

The effect of the configuration of the present invention will now be described through a comparison of examples thereof with comparative examples. First, a protective film was formed on the surface of a press-forming mold. The mold in the present examples is a die and a punch made from steel equivalent to SKD11 in which the hardness has been adjusted to 60 HRC. The protective film was formed by molten salt immersion (TD) or arc ion plating. In molten salt immersion, the mold was immersed in a VC-based salt bath and a VC-based protective film was formed on the surface, quenching and tempering processes were then applied, and lapping was then performed, whereby a protective film was formed at a thickness of 8 μm. In arc ion plating, using a target (negative electrode) material containing 50 atom % of Ti and 50 atom % of Al (with each of the components also containing unavoidable impurities), and using nitrogen gas or a gas mixture of nitrogen and a hydrocarbon such as methane as the process gas to be introduced into the chamber, a TiC-based, TiN-based, or a TiAlN-based protective film was formed at a variety of thicknesses on the surface of the mold by arc ion plating in each of the process gas atmospheres.

Then, each of the protective films was polished. The polishing was managed by tracing the surface of each of the protective films using a stylus displacement pickup (tip shape: conical; tip diameter: 5 μm) provided to a surface roughness tester (Tokyo Seimitsu; HANDYSURF E-35B; height-direction resolution: 0.01 μm), analyzing the tracing results using an analysis software (Tokyo Seimitsu; TiMS Light), and calculating the RΔq in compliance with JIS B0601 and JIS B0031. The cutoff value λc of the measurement results was set to 0.8 mm, and the measurement length l was set to 4.0 mm. At the same time, the arithmetic average roughness Ra and the maximum height Ry stipulated in JIS B0601 were calculated for each of the examples and comparative examples. For each of the examples and comparative examples, the die 11 and the punch 12 having a protective film formed thereon were placed on a press-forming device 10 as shown in FIG. 6, and a metal plate 2 was placed on the punch 12. An elastic force was then applied across a pad 13 or a similar element using, e.g., an elastic member, whereby the plate material 2 was fixed on the punch 12. In this state, the die 11 was lowered from above the plate material 2, and the plate material 2 was sandwiched between the die 11 and the punch 12, whereby the plate material 2 was press-formed. For the metal plate 2, a hot-rolled soft steel plate (SPH590) having a plate thickness of 3.2 mm was used, and was press-formed without a lubricant oil (i.e., with only the anti-rust material for the work material). The processing speed was 40 shots per minute (spm), and the ironing ratio (amount of reduction in plate thickness/original plate thickness) was 7%. The results of measuring the number of possible shots in each of the examples and comparative examples are shown in Table 1. For the third example and the fourth, seventh, and eighth comparative examples, tracing was performed using the abovementioned surface roughness tester, and the tracing results were analyzed using the abovementioned analysis software. The analyzed surface roughness curves of the protective films are shown in FIGS. 7(a) to (d).

TABLE 1

|  | No. | Film formation method | Film type | Film thickness μm | Ra μm | ry μm | RΔq | No. of possible shots |
|---|---|---|---|---|---|---|---|---|
| Examples | 1 | PVD(AIP) | TiAlN | 10 | 0.06 | 0.80 | 0.032 | No |
|  | 2 | PVD(AIP) | TiAlN | 10 | 0.07 | 0.59 | 0.031 | seizing |
|  | 3 | PVD(AIP) | TiAlN | 10 | 0.04 | 0.50 | 0.025 | at 3000 |
| Comparative examples | 4 | Molten salt immersion (TD) | VC | 8 | 0.04 | 0.53 | 0.021 | 2000 |
|  | 5 | PVD(AIP) | TiN | 3 | 0.13 | 1.37 | 0.042 | 300 |
|  | 6 | PVD(AIP) | TiC | 5 | 0.08 | 0.85 | 0.050 | 945 |
|  | 7 | PVD(AIP) | TiAlN | 10 | 0.12 | 1.08 | 0.054 | 40 |
|  | 8 | PVD(AIP) | TiAlN | 10 | 0.08 | 0.78 | 0.036 | 120 |

As shown in Table 1, in the first through third examples, which satisfy the configuration of the present invention, the number of possible shots dramatically improved in comparison with the fourth comparative example, in which the protective film was formed by molten salt immersion, and with fifth through eighth comparative examples in which the parameter RΔq exceeded 0.0352, and no seizing occurred even after 3000 shots.

Figure 7:
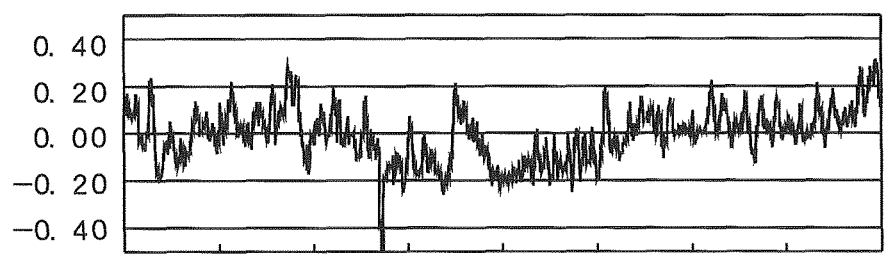
FIGS. 7(a) through (d) show the results of measuring the surface roughness of each test piece in the examples of the present invention.
Figure 7:
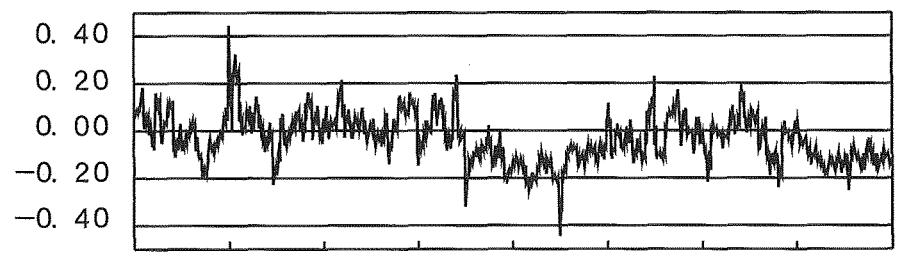
Figure 7:
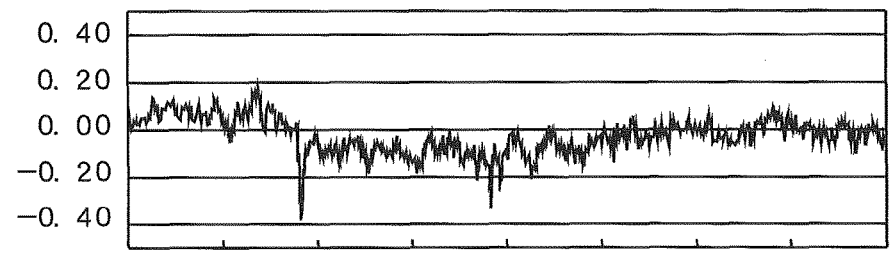
Figure 7:
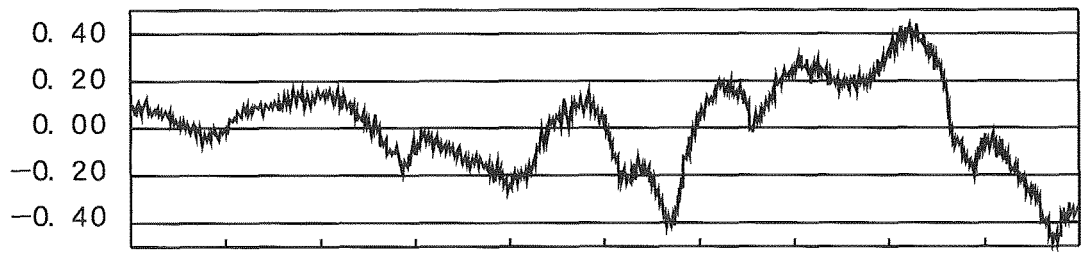
Figure 8:
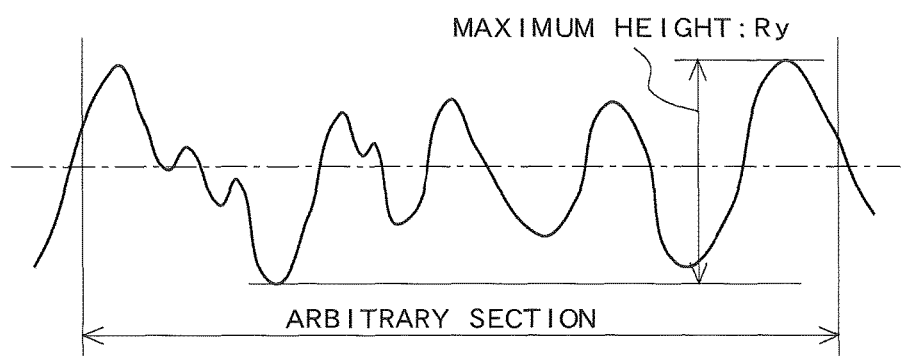
FIGS. 8(a) and (b) show an example of the surface of the protective film before and after lapping in an instance in which the surface roughness is defined by maximum height.
Figure 8:
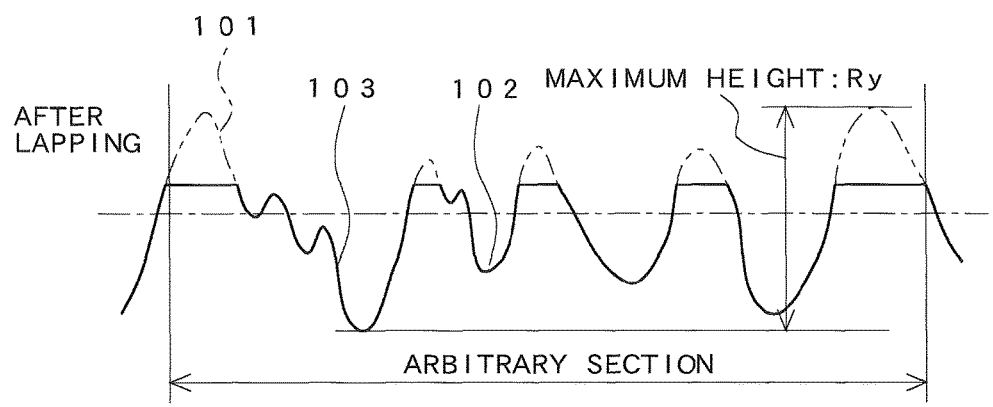
Figure 9:
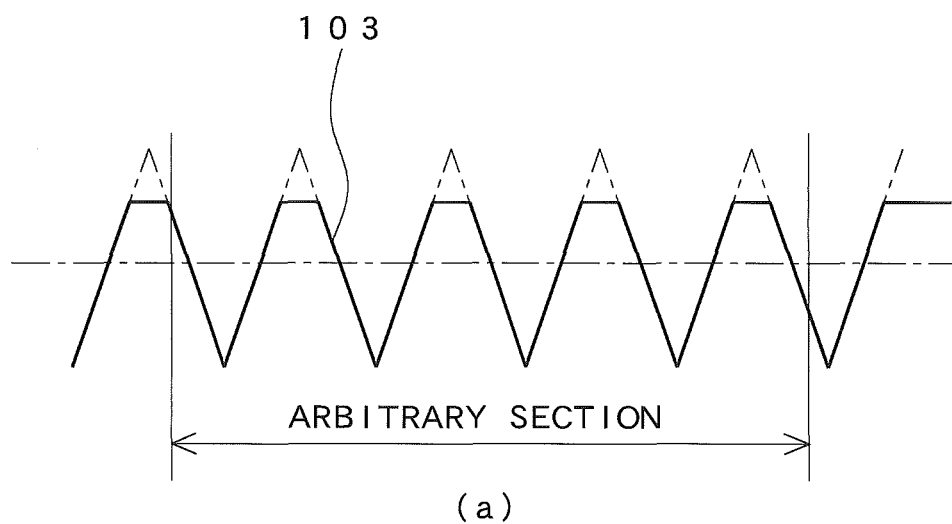
FIGS. 9(a) and (b) are schematic diagrams showing the surface states in which the surface roughness is defined using a conventional reference.
Figure 9:
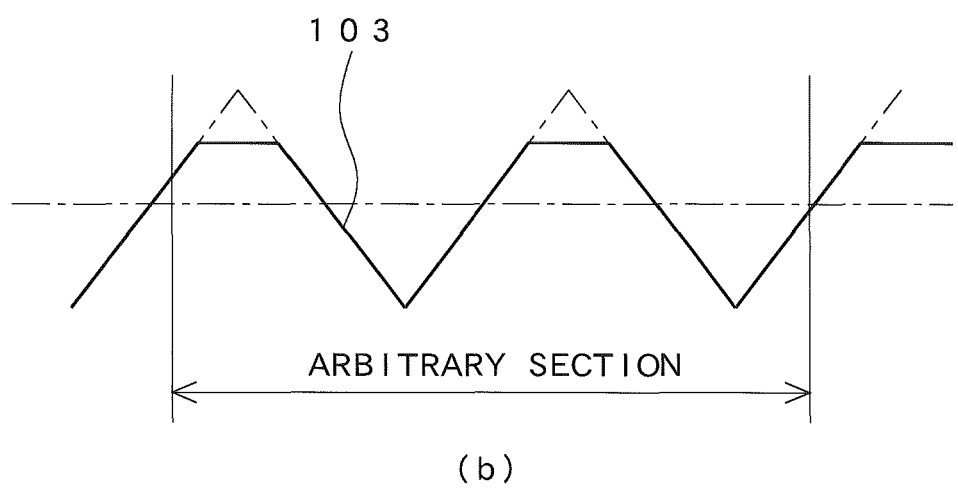

As shown in Table 1, when a comparison is made between the first, second, and third examples and the seventh and eighth comparative examples, all of which involve the use of a TiAlN-based coating, it can be seen that there is a clear correlation between the number of possible shots and RΔq. In addition, in light of the fact that there is a large difference in the number of possible shots between the second example and the eighth comparative example, between which the arithmetic average roughness Ra has a substantially identical value, and between the first example and the eighth comparative example, between which the maximum height Ry is substantially identical, it can be seen that the lifespan of the mold is strongly correlated with RΔq. When the third example and the fourth comparative example are compared, the shot lifespan is greater in the third example, even though the fourth comparative example has a smaller RΔq; this indicates that the TiAlN coating formed by PVD has a longer lifespan. Also, as shown in FIG. 7(a) (seventh comparative example) and FIG. 7(b) (eighth comparative example), both the convex and concave structures on the surface of the protective film are larger when RΔq is exceeding 0.032, and the convex and concave structures decrease in size with the decrease in RΔq. Once the parameter RΔq falls to 0.032 or less, the convex and concave structures on the surface of the protective film become extremely small as shown in FIG. 7(c) (third example). Therefore, in the present invention, performing polishing while managing the surface roughness using the parameter RΔq makes it possible to reliably improve the lifespan of the press-forming mold. In FIG. 7(d) (fourth comparative example), since the protective film is formed by molten salt immersion, adhesion of droplets does not take place, and the effect of the present invention of managing the surface roughness using the parameter RΔq is smaller.

INDUSTRIAL APPLICABILITY

The present invention makes it possible to improve the seizing resistance of the press-forming mold having a protective film formed by PVD, and contributes towards improving the wear resistance of the press-forming mold.

KEY

10 Press-forming device
11 Die
12 Punch
13 Pad
2 Plate material (metal plate)

What is claimed is:

1. A press-forming mold comprising:
   a protective film for preventing seizing during press-forming, which is formed on at least a forming surface that comes into contact with a formed body, wherein:
   said protective film is formed by PVD;
   an arbitrary selection section extracted from the surface of the protective film is divided into a plurality of individual sections; and,
   when the $n^{th}$ division point from an end of said selected section is defined as being located a distance of dXn in the direction of extension of said selected section and dZn in the height direction from the $(n-1)^{th}$ division point, and the gradient of the surface at said $n^{th}$ division point is represented by (dZn/dXn), taking N to represent the number of divisions, the root-mean-square RΔq calculated by the following expression is no greater than 0.032:

$$R\Delta q = \sqrt{\frac{1}{N}\sum_{n=1}^{N}\left(\frac{dZ_n}{dX_n}\right)^2}.$$

2. The press-forming mold according to claim 1, wherein said protective film is one that is formed by PVD in which a metal material containing at least 50 atom % of Al is used as a target.

3. The press-forming mold according to claim 2, wherein said protective film is one in which a first thin film comprising a TiAlN-based material is formed on a side that comes into contact with said formed body.

4. The press-forming mold according to claim 3, wherein said protective film is one in which a second thin film comprising a CrN-based material is formed on said forming surface, and said first thin film formed on the second thin film.

5. A method for manufacturing a protective film for a press-forming mold in which a protective film for preventing seizing during press-forming is formed on at least a forming surface of the press-forming mold that comes into contact with a formed body,
   the method comprising:
   forming a protective film by PVD on said forming surface in a reaction gas atmosphere using, as a target, a metallic material to become said protective film; and
   polishing the surface of the protective film;
   wherein in said polishing the surface of the protective film, the polishing is performed so that:
   an arbitrary selection section extracted from the surface of said protective film is divided into a plurality of individual sections; and
   when the $n^{th}$ division point from an end of said selected section is defined as being located a distance of dXn in the direction of extension of said selected section and dZn in the height direction from the $(n-1)^{th}$ division point, and the gradient of the surface at said $n^{th}$ division point is represented by (dZn/dXn), the root-mean-square RΔq calculated by the following expression is no greater than 0.032:

$$R\Delta q = \sqrt{\frac{1}{N}\sum_{n=1}^{N}\left(\frac{dZ_n}{dX_n}\right)^2}.$$

6. The press-forming mold according to claim 1, wherein the protective film comprises:
   a first film formed on the forming surface and comprising a CrN-based material and having a thickness in range from 2μ to 5μ; and
   a second film formed on the first film and comprising a TiAlN-based material and having a thickness in range from 1μ to 5μ.

7. The press-forming mold according to claim 1, wherein the root-mean-square RΔq is equal to or less than 0.030.

8. The press-forming mold according to claim 1, wherein the PVD comprises arc ion plating.

9. A method for manufacturing a protective film for a press-forming mold, the method comprising:
   forming a thin film on the mold comprising:
   placing the mold on a rotary table connected to a bias power source in a chamber;
   supplying a process gas into the chamber;
   placing a target comprising a metal material and connected to an arc power source in the chamber;
   supplying power from the bias and arc power sources, to generate an arc discharge between the mold and the target, and form an arc spot on a surface of the target, such that electrical energy concentrating on the arc spot causes a component of the metal material to instantaneously vaporize and ionize, a product of a reaction between the ionized metal material and the process gas being formed on a surface of the mold to form the thin film; and
   after the thin film reaches a predetermined thickness, removing the mold from the chamber; and
   polishing a surface of the thin film until the surface has a root mean square surface roughness (RΔq) which is not greater than 0.032.

10. The method claim 9, wherein the target comprises 52 to 55 atom % of Al.

11. The method of claim 10, wherein the target further comprises 20 to 22 atom % of Ti, 20 to 22 atom % of Cr, and Si.

12. The method of claim 9, further comprising:

before the forming of the thin film, forming a base film comprising a CrN-based material on the surface of the mold by arc ion plating using a target comprising metal Cr and 50 atom % or less of Group 4, Group 5, or Group 6A metal elements.

13. The method of claim 9, wherein the polishing comprises:

tracing the surface of the protective film using a stylus displacement pickup provided to a surface roughness tester;

analyzing a result of the tracing of the surface of the protective film using an analysis software; and calculating the root mean square surface roughness (RΔq) based on the analyzed result.

14. The method of claim 13, wherein the calculating of the root mean square surface roughness (RΔq) comprises:

extracting an arbitrary selection section extracted from the surface of the protective film and dividing the selected section into a plurality of individual sections; and when the $n^{th}$ division point from an end of said selected section is defined as being located a distance of dXn in the direction of extension of said selected section and dZn in the height direction from the $(n-1)^{th}$ division point, and the gradient of the surface at said $n^{th}$ division point is represented by (dZn/dXn), taking N to represent the number of divisions, calculating the root-mean-square RΔq by the following expression:

$$R\Delta q = \sqrt{\frac{1}{N}\sum_{n=1}^{N}\left(\frac{dZ_n}{dX_n}\right)^2}.$$

* * * * *